United States Patent [19]

Tobin

[11] Patent Number: 4,740,483
[45] Date of Patent: Apr. 26, 1988

[54] SELECTIVE LPCVD TUNGSTEN DEPOSITION BY NITRIDATION OF A DIELECTRIC

[75] Inventor: Philip J. Tobin, Austin, Tex.

[73] Assignee: Motorola, Inc., Schaumburg, Ill.

[21] Appl. No.: 20,847

[22] Filed: Mar. 2, 1987

[51] Int. Cl.⁴ .......................................... H01L 21/443
[52] U.S. Cl. .................................... 437/187; 437/203; 437/242; 437/245; 148/DIG. 112
[58] Field of Search ........... 148/DIG. 112, DIG. 114; 357/54; 437/187, 203, 242, 245

[56] References Cited

U.S. PATENT DOCUMENTS

| | | | |
|---|---|---|---|
| 4,349,408 | 9/1982 | Tarng et al. | 156/628 |
| 4,485,393 | 11/1984 | Kumamaru et al. | 357/52 |
| 4,517,225 | 5/1985 | Broadbent | 427/89 |
| 4,619,038 | 10/1986 | Pintchovski | 29/590 |
| 4,621,277 | 11/1986 | Ito et al. | 357/54 |
| 4,648,175 | 3/1987 | Metz, Jr. et al. | 29/589 |
| 4,666,553 | 5/1987 | Blumenfeld | 156/643 |

OTHER PUBLICATIONS

Broadbent et al., J. Electrochem Soc.: Solid-State Sci. and Tech., v. 133, No. 8 (Aug. 1986), pp. 1715-20.
Levy et al., J. Electrochem. Soc.: Solid-State Sci. and Tech., v. 133, No. 9 (Sep. 1986), pp. 1905-1912.

Primary Examiner—Olik Chaudhuri
Attorney, Agent, or Firm—John A. Fisher; Jeffrey Van Myers; Robert L. King

[57] ABSTRACT

A process for selective deposition of a refractory metal such as tungsten at high temperatures and low pressure via chemical vapor deposition during semiconductor device manufacturing is provided. A dielectric layer is nitrided by chemical deposition of a nitrogen bearing gas prior to LPCVD deposition of tungsten for purposes such as contact metallization of current conducting electrodes and current controlling electrodes of transistors. Since nitridation of the dielectric is a surface chemical reaction and not an addition of material to the dielectric, no additional complexity is introduced into the LPCVD process. The refractory metal does not substantially deposit on the nitrided dielectric thereby providing selective metal deposition.

17 Claims, 3 Drawing Sheets

SELECTIVE LPCVD TUNGSTEN DEPOSITION BY NITRIDATION OF A DIELECTRIC

TECHNICAL FIELD

This invention concerns the manufacture of MOS integrated circuits, and more particularly concerns the selective deposition of tungsten by low pressure chemical vapor deposition (LPCVD).

BACKGROUND ART

Tungsten deposition is commonly used in the manufacture of semiconductors to form metal regions on semiconductor substrates. Tungsten is a refractory metal having properties such as low electrical resistivity, a high melting point, and high resistance to electromigration. The refractory metal properties make tungsten very desirable for many semiconductor structures. Tungsten may be deposited either uniformly over the whole wafer surface or selectively over predetermined portions of the wafer surface depending upon deposition conditions. A common problem in the selective chemical vapor deposition (CVD) of tungsten onto silicon with a tungsten bearing gas such as tungsten hexafluoride, $WF_6$, is the fact that the chemical reaction which is used to deposit tungsten is self limiting. After tungsten is deposited onto a silicon surface to a certain thickness using tungsten hexafluoride and silicon reduction, hydrogen must be bled into the CVD reaction in order to make tungsten further deposit by a hydrogen reduction type of process. However, unless a proper composition and extremely clean adjacent dielectric surface exists, deposition of tungsten occurs on both the tungsten surface created by the initial part of the process and the adjacent dielectric. The deposition on the adjacent dielectric surface is usually in discrete areas or islands. If the selectivity is poor or the deposition time is long, the islands may grow laterally and eventually form a continuous layer on the dielectric. In such a case, selectivity is totally lost. Adjacent dielectric surfaces are typically either silicon dioxide or silicate glasses. Others have proposed various ways to maintain the silicon oxide surface free of tungsten during the deposition of a thick layer of tungsten on exposed silicon. For example, in U.S. Pat. No. 4,617,087 Iyer et al. teach the use of a plasma in a CVD chamber to maintain silicon dioxide clean enough to obtain a selective tungsten etch. However, additional processing steps are required to create a plasma. Others have treated the dielectric with a wet chemical to prevent tungsten deposition. However, the wet chemical treatment requires an additional process flow step and is not easy to control.

BRIEF DESCRIPTION OF THE INVENTION

Accordingly, an object of the present invention is to provide improved selectivity when depositing tungsten in a semiconductor process.

Another object of the present invention is to provide an improved method for selectively depositing tungsten in an LPCVD process by nitridation of a dielectric.

Yet another object of this invention is to provide an improved method for providing straight wall contact metallization in an integrated circuit process.

A further object of the present invention is to provide an improved selective chemical vapor deposition of tungsten.

In carrying out the above and other objects of the present invention, there is provided, in one form, a method for selectively depositing a refractory metal on silicon and polysilicon surfaces in an LPCVD process. The present invention may be used in conjunction with various semiconductor structures including a transistor. For use with a transistor structure, a transistor is formed having source and drain regions in a semiconductor substrate and a gate region separated from the substrate by an insulator. A dielectric material having a top surface and a bottom surface is formed over the transistor with the bottom surface covering the transistor. The top surface of the dielectric material is nitrided by reacting a nitrogen bearing gas with the dielectric material. A contact region is formed with the source, drain and gate regions of the transistor. The refractory metal is then selectively deposited to a predetermined thickness on the source, drain and gate regions of the transistor by chemical vapor deposition without being deposited on the top surface of the dielectric material.

These and other objects, features and advantages will be more clearly understood from the following detailed description taken in conjunction with the accompanying drawings.

DETAILED DESCRIPTION OF THE INVENTION

Figure 1A:
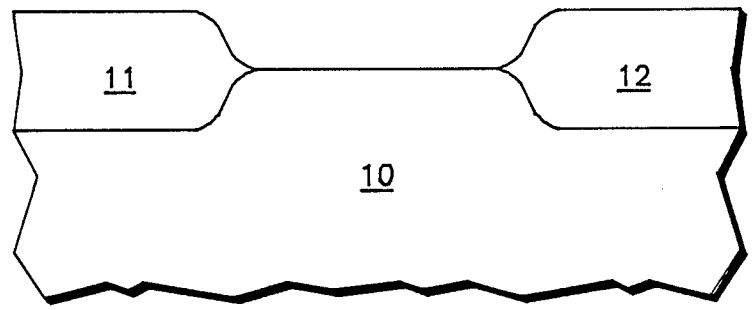
FIGS. 1A through 1F are schematic, cross-sectional illustrations showing the various stages of this invention as tungsten is deposited to make electrical contact with source, drain and gate electrodes in MOS devices of an integrated circuit.

Shown in FIG. 1A is a cross-sectional view of the initial formation of a transistor. In the illustrated form, an MOS transistor process will be assumed. However, it should be readily apparent that the present invention may be utilized in connection with other types of transistors such as bipolar transistors or other types of semiconductor structures. A silicon substrate 10 is provided upon which a field oxide isolation region 11 is formed on an upper surface of substrate 10. A field oxide isolation region 12 is also applied to the upper surface of substrate 10 but laterally separated from field oxide isolation region 11 by a predetermined distance. A transistor will be formed between field oxide isolation regions 11 and 12.

Figure 1B:
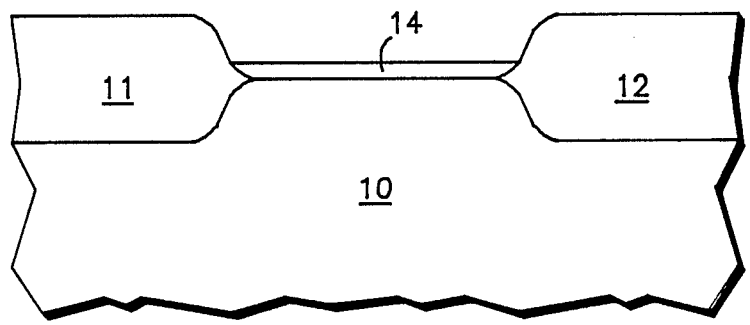

Shown in FIG. 1B is a cross-sectional view of the structure of FIG. 1A wherein a gate oxide 14 is deposited over substrate 10 between field oxide layers 11 and 12. Gate oxide 14 forms an electrically insulating layer over substrate 10.

Figure 1C:
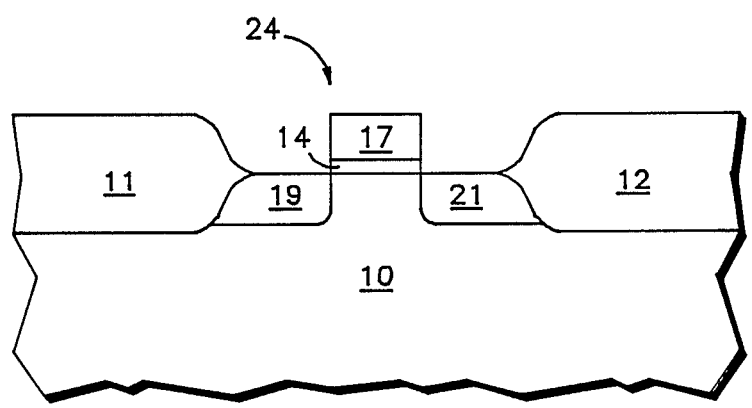

Shown in FIG. 1C is a cross-sectional view of the structure of FIG. 1B wherein a polysilicon gate region 17 is formed on gate oxide 14. Gate oxide 14 is removed adjacent the polysilicon gate region 17, and a source region 19 and a drain region 21 are diffused into substrate 10. Fabrication of a conventional MOS transistor structure 24 has been described up to this point in the discussion.

Figure 1D:
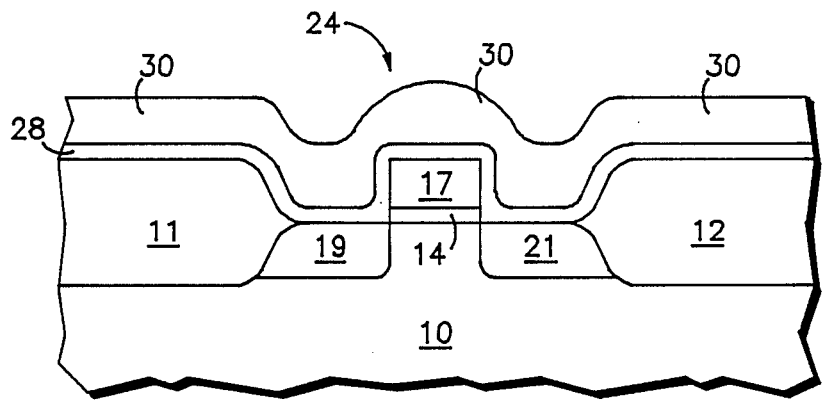

Shown in FIG. 1D is a cross-sectional view of the structure of FIG. 1C in which an undoped low temperature oxide (LTO) 28 has been applied over field oxide isolation regions 11 and 12 and transistor structure 24. The undoped LTO 28 is typically a thin non-flowable layer. A dielectric 30 is then applied over the LTO 28 layer. In a preferred form, dielectric 30 is a flowable dielectric which readily flows to cover transistor structure 24. Phosphosilicate glass (PSG) and borophosphosilicate glass (BPSG) are examples of two flowable dielectrics which are commonly used. In a conventional transistor process, a metal contact is made with each of the gate, source and drain regions of the transistor 24 structure. The metallization is typically accomplished in an LPCVD process by making a straight wall etch of dielectric 30 to expose the top surfaces of source 19, drain 21 and gate 17. A metal deposition onto source 19, drain 21 and gate 17 is accomplished in a reaction chamber by chemical vapor deposition of a refractory metal such as tungsten. The problem with this described procedure is that the metal deposition in the LPCVD process is not consistently selective. When tungsten is utilized, tungsten is deposited not only on the desired source, drain and gate regions but is also deposited on the upper surface of dielectric 30 to a varying degree. For example, when phosphosilicate glass (PSG) is used as a dielectric, tungsten is deposited by isolated region nucleation onto the PSG in an LPCVD process in an estimated amount of 14 to $26 \times 10^4$ islands per square centimeter per minute when deposited for eighty minutes. When tungsten is deposited in the LPCVD process for two hundred sixty-five minutes using PSG as a dielectric, a continuous layer of deposited tungsten exists on the PSG. When annealed BPSG is used as a dielectric, tungsten is deposited onto the PSG in an LPCVD process in an estimated amount of $19 \times 10^4$ islands per square centimeter per minute when deposited for eighty minutes. When tungsten is deposited in the LPCVD process for two hundred sixty-five minutes using annealed BPSG as a dielectric, a continuous layer of deposited tungsten exists on the BPSG. Therefore, the most common flowed dielectric materials receive appreciable tungsten deposition during an LPCVD process. In contrast, when a low temperature oxide (LTO) is used as a dielectric, tungsten is deposited onto the LTO after approximately two hundred sixty-five minutes in an estimated amount of $1 \times 10^4$ islands per square centimeter per minute. However, LTO is a rigid dielectric and many processes require a flowable dielectric to reliably implement. Therefore although LTO provides improved results, a need exists for a flowable dielectric which does not readily allow tungsten to deposit thereon. The estimated results provided above are measured in units of the number of tungsten islands per square centimeter and are to be understood as being representative with respect to their relative values. It should be readily apparent that the values can be reduced proportionately by optimization of a chemical cleaning step prior to tungsten deposition.

The present invention provides a method to use a flowable dielectric such as BPSG which selectively prevents the deposition of tungsten during a LPCVD process in a reaction chamber. Assume for purposes of discussion that BPSG, represented as $Si_aO_bP_cB_d$ is used for dielectric 30, where a, b, c and d represent the atomic fraction of each element. After the BPSG flows over the transistor 24 structure at a temperature of between 800 and 1200 degrees Centigrade, a nitrogen bearing gas is allowed to flow into the LPCVD reaction chamber. The nitrogen bearing gas reacts at the surface of the BPSG to chemically change the surface of the BPSG.

Figure 1E:
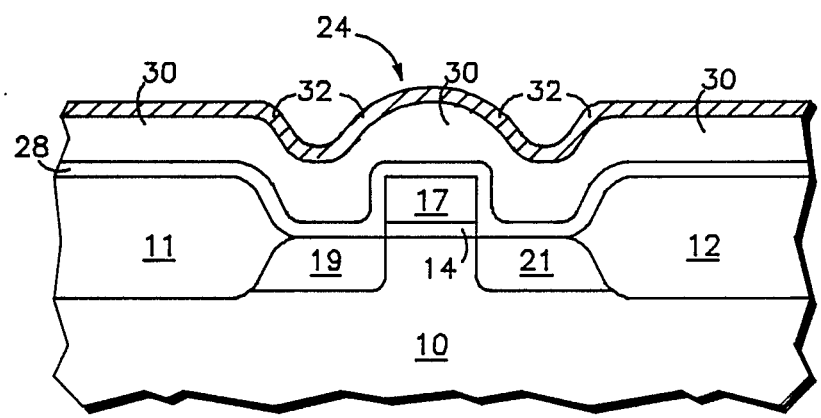

Shown in FIG. 1E is a cross-sectional view of transistor structure 24 after the nitrogen bearing gas has reacted at the surface of dielectric 30. For purposes of illustration only, assume dielectric 30 is comprised of BPSG. The surface of the BPSG dielectric 30 is converted to a different material 32 which contains nitrogen and which is illustrated by light hash marks slanted from lower left to upper right. The chemical reaction does not add a new additional surface layer to the BPSG or substantially change the thickness of dielectric 30 but rather changes the top surface of the BPSG by nitriding the surface. Any of several nitrogen bearing gases may be used in this chemical reaction to nitride the glass including pure nitrogen, $N_2$, ammonia, $NH_3$ or theoretically hydrazine, $N_2H_2$, if proper precautions are made due to the reactivity of hydrazine. A preferred nitrogen bearing gas for use with the present invention is ammonia. When ammonia is used in the LPCVD chamber, the surface chemical reaction may be represented as:

$$NH_3 + Si_aO_bP_cB_d \rightarrow Si_{a'}O_{b'}P_{c'}B_{d'}N_{e'} \qquad (1)$$
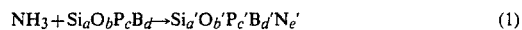

where a, b, c and d and a', b', c', d' and e' represent the atom fraction before and after nitridation, respectively. As can readily be seen, the nitrided surface 32 is not a silicon nitride layer but rather is a different chemical substance containing nitrogen which results from the chemcial reaction which occurs at the surface of dielectric 30. In generic terms, the surface chemical reaction may be represented as:

$$X(N) + R \rightarrow R(N) \qquad (2)$$

where X(N) is any nitrogen bearing gas which will nitride a dielectric such as glass and R is any dielectric. The above described surface reaction may also be accomplished by creating a plasma discharge in which case the temperature required to produce nitridation of the dielectric surface is substantially reduced to a temperature such as 500 degrees Centigrade. Also, rapid thermal processing may be utilized to create the dielectric surface reaction.

Figure 1F:
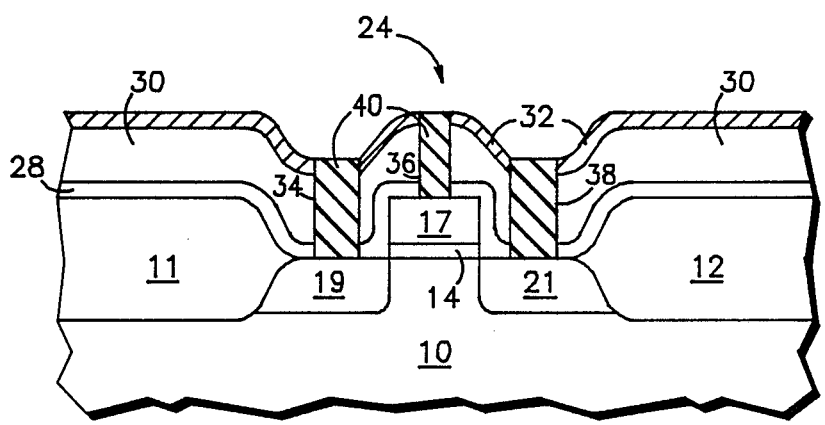

Shown in FIG. 1F is a cross-sectional view of transistor structure 24 after straight wall contacts 34, 36 and 38 have been etched from the nitrided top surface of dielectric 30 to the top surfaces of source 19, gate 17 and drain 21, respectively. Tungsten 40 which is illustrated by thicker cross hatching slanted from upper left to lower right of FIG. 1F is selectively deposited by the conventional LPCVD process into straight wall contacts 34, 36 and 38 to a depth which ideally just reaches the level of nitrided surface 32. During the LPCVD process tungsten does not substantially deposit on the nitrided dielectric surface 30 by nucleation. Therefore, the deposition of tungsten into the contact fill areas is very selective. When tungsten is deposited in the LPCVD process for two hundred sixty-five minutes using nitrided BPSG as a dielectric as shown in FIG. 1F, only approximately $6 \times 10^4$ tungsten islands per square centimeter per minute were noted being deposited on the nitrided dielectric. Therefore, the presence of nitrogen being added to the BPSG material to create a nitrided glass material at the top of the BPSG functions to prevent or reduce tungsten deposition on the dielectric.

In the illustrated form, it should be noted that the present invention does not function to build a silicon nitride layer on top of the dielectric 30. In fact, the nucleation rate on silicon nitride (Si₃N₄) has been previously noted to be much higher than that on PSG. In an article entitled "The Kinetics of Tungsten Growth on Thermal Oxide" found in *Tungsten & Other Refractory Metals for VLSI Applications* by McConica and Cooper (Materials Research Society, 1986, pages 197-207, McConica and Cooper mention at page 207 the disadvantage of using a silicon nitride layer when selective tungsten deposition is desired.

Figure 2A:
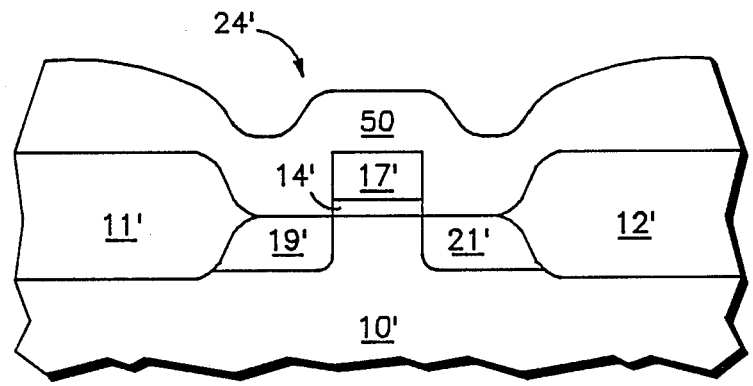
FIGS. 2A through 2C are schematic, cross-sectional illustrations showing the various stages of an alternative embodiment of this invention.

Shown in FIG. 2A is a cross-sectional view of a further embodiment of the present invention which provides an alternative to using the transistor structure 24 of FIG. 1. A transistor sturcture 24' is illustrated wherein common elements between transistor structure 24' and transistor structure 24 are similarly numbered in FIG. 2 but are differentiated with a prime symbol. Transistor stucture 24' has a substrate 10', field oxide isolation regions 11' and 12', and a gate region 17' formed on a gate oxide 14' interposed between a source region 19' and a gate region 21'. A nonflowable low temperature oxide (LTO) layer 50 is deposited over the structure 24' to a depth sufficient so that the lowest portion of the top surface of the layer 50 is above the upper surface of field oxide layers 11' and 12'.

Figure 2B:
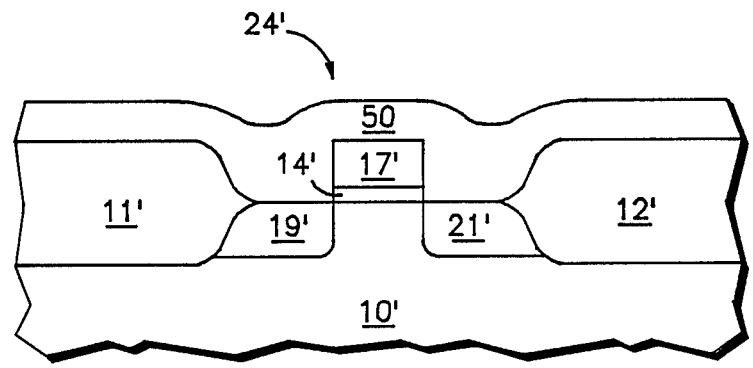

Shown in FIG. 2B is a cross-sectional view of transistor structure 24' after application of a planarizing photoresist layer (not shown) and LTO nonselective etch has been applied to the top surface. The effect of the photoresist and LTO etch is to substantially planarize the top surface of transistor structure 24'.

Figure 2C:
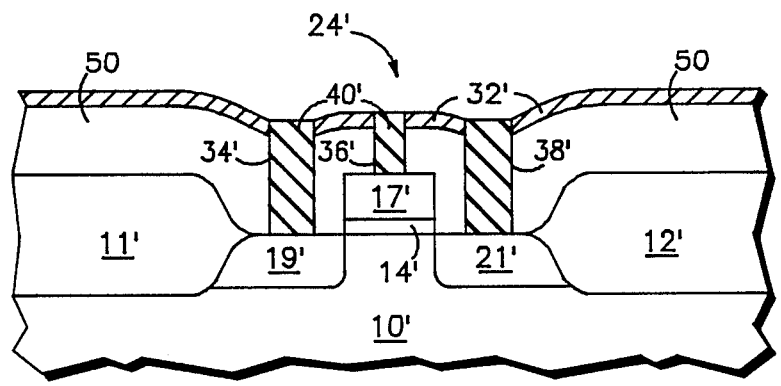

Shown in FIG. 2C is a cross-sectional view of transistor structure 24' after a nitrogen bearing gas has reacted at the surface of LTO layer 50 to convert the surface of the LTO to a different material 32' which contains nitrogen. The different material 32' is illustrated by cross hatching directed from lower left to upper right of FIG. 2C. Straight wall contacts 34', 36' and 38' are then etched thru material 32' and LTO layer 50 to the top surfaces of source 19', gate 17' and drain 21', respectively, in a manner analogous with the steps described in connection with FIG. 1F. Tungsten 40' which is illustrated by cross hatching directed from upper right to lower left of FIG. 2C is selectively deposited into straight wall contacts 34', 36' and 38' to a depth which ideally just reaches the top surface of nitrided LTO layer 50. During the LPCVD process tungsten does not substantially deposit on the nitrided LTO layer 50 by nucleation. Again, the deposition of tungsten into the contact fill areas is very selective.

By now it should be apparent that an electronic process has been provided which is particularly advantageous for straight wall contact metallization in small transistor geometry processes. It should be well understood that the present invention may be utilized with other types of transistor structures in addition to MOS process transistors. The present invention does not utilize an additional process step to accomplish the selective tungsten deposition. The chemical reaction which occurs at the surface of the dielectric does not increase the size of the transistor structure 24 or change the electrical characteristics of the transistor device. Although the process has discussed the use of BPSG as a dielectric, the present invention may be utilized with any type of dielectric.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A process for selectively forming a refractory metal on silicon and polysilicon surfaces via low pressure chemical vapor deposition (LPCVD) comprising the steps of:
    forming a transistor having first and second current electrode regions in a semiconductor substrate and a current control region separated from the substrate by an insulator;
    providing a dielectric material having a top surface and a bottom surface which covers the transistor;
    nitriding the top surface of the dielectric material by reacting a nitrogen bearing gas with the dielectric material;
    forming a contact region with the first and second current electrode regions and the current control region of the transistor; and
    selectively depositing the refractory metal on the first and second current electrode regions and the current control region of the transistor by chemical vapor deposition substantially without depositing the refractory metal on the top surface of the dielectric material.

2. The process of claim 1 wherein the refractory metal is tungsten.

3. The process of claim 1 wherein the dielectric material is a flowable material.

4. The process of claim 3 wherein the flowable material is borophosphosilicate glass.

5. The process of claim 1 wherein the nitridation of the dielectric is at a temperature substantially in the range of 800° to 1300° C.

6. The process of claim 1 wherein the nitridation of the flowed dielectric is acheived with a plasma discharge.

7. The process of claim 1 wherein the nitrogen bearing gas is ammonia.

8. The process of claim 1 wherein the dielectric is a nonflowable low temperature oxide.

9. A process for selectively forming tungsten on silicon and polysilicon surfaces via low pressure chemical vapor deposition (LPCVD) comprising the steps of:
    forming an electrode region in a semiconductor substrate;
    providing a dielectric material having a top surface and a bottom surface which covers the electrode region;
    nitriding the top surface of the dielectric material by reacting a nitrogen bearing gas with the dielectric material;
    forming a contact region with the electrode region; and
    selectively depositing the tungsten on the current electrode region by chemical vapor deposition substantially without depositing the tungsten on the top surface of the dielectric material.

10. The process of claim 9 wherein the dielectric material is a flowable material.

11. The process of claim 10 wherein the flowable material is borophosphosilicate glass.

12. The process of claim 9 wherein the nitridation of the dielectric is at a temperature substantially in the range of 800° to 1300° C.

13. The process of claim 9 wherein the nitridation of the flowed dielectric is acheived with a plasma discharge.

14. The process of claim 9 wherein the nitrogen bearing gas is ammonia.

15. The process of claim 9 wherein the dielectric is a nonflowable low temperature oxide.

16. A process for selectively forming a refractory metal on silicon and polysilicon surfaces via low pressure chemical vapor deposition (LPCVD) comprising the steps of:

forming at least one current electrode region in a semiconductor substrate;

providing a nonflowable dielectric material having a top surface and a bottom surface which covers the current electrode region;

etching the nonflowable dielectric material to substantially planarize the top surface of the dielectric material;

nitriding the top surface of the dielectric material by reacting a nitrogen bearing gas with the dielectric material;

forming a contact region with the current electrode region; and selectively depositing the refractory metal on the current electrode region by chemical vapor deposition substantially without depositing the refractory metal on the top surface of the dielectric material.

17. The process of claim 16 wherein the nonflowable dielectric material is a low temperature oxide.

* * * * *